United States Patent [19]
Yang

[11] Patent Number: 5,604,367
[45] Date of Patent: Feb. 18, 1997

[54] COMPACT EEPROM MEMORY CELL HAVING A FLOATING GATE TRANSISTOR WITH A MULTILAYER GATE ELECTRODE

[75] Inventor: Ming T. Yang, Hsin-Chu, Taiwan

[73] Assignee: United Microelectronics Corporation, Hsin-Chu, Taiwan

[21] Appl. No.: 494,584

[22] Filed: Jun. 23, 1995

Related U.S. Application Data

[62] Division of Ser. No. 305,559, Sep. 14, 1994, Pat. No. 5,439,838.

[51] Int. Cl.$^6$ .................................................. H01L 29/788
[52] U.S. Cl. .......................... 257/321; 257/316; 257/326; 257/649; 257/324
[58] Field of Search .................................. 257/316, 321, 257/324, 326, 317, 318, 320, 649

[56] References Cited

U.S. PATENT DOCUMENTS

| | | | |
|---|---|---|---|
| 4,996,572 | 2/1991 | Tanaka et al. | 257/324 |
| 5,029,130 | 7/1991 | Veh | 365/185 |
| 5,067,108 | 11/1991 | Jenq | 365/185 |
| 5,077,691 | 12/1991 | Haddad et al. | 365/218 |
| 5,284,786 | 2/1994 | Sethi | 257/321 |
| 5,404,037 | 4/1995 | Manley | 257/318 |

Primary Examiner—Sara W. Crane
Assistant Examiner—David B. Hardy
Attorney, Agent, or Firm—William H. Wright

[57] ABSTRACT

A method of forming an EEPROM memory cell on a semiconductor substrate, comprises forming a first dielectric layer on the substrate, a gate electrode of a select transistor and a first layer of a floating gate electrode of an EEPROM device on the dielectric layer, ion implanted source/drain regions in the substrate adjacent to the gate electrode and the first layer of the floating gate electrode proximate to at least the periphery of the gate electrode and the first layer of the floating gate electrode. The central region of the ion implanted regions is between the gate electrode and the first layer of the floating gate electrode. A tunneling oxide layer is formed above the central region using the electrodes to form the boundaries of the tunneling oxide layer, a second layer of the floating gate electrode in contact with the first layer of the floating gate electrode and in contact with the upper surface of the tunneling oxide layer, additional dielectric material over the upper surface of the device, and a control gate electrode deposited upon the surface of the additional dielectric material.

8 Claims, 9 Drawing Sheets

COMPACT EEPROM MEMORY CELL HAVING A FLOATING GATE TRANSISTOR WITH A MULTILAYER GATE ELECTRODE

This is a divisional of application Ser. No. 08/305,559, filed Sep. 14, 1994, now U.S. Pat. No. 5,439,838.

BACKGROUND OF THE INVENTION

1. Field of the Invention

This invention relates to semiconductor devices and more particularly to EEPROM devices.

2. Description of Related Art

EEPROM (Electrically Erasable Programmable Read Only Memory) devices are well known in the art, as described in U.S. Pat. No. 5,077,961 of Haddad et al for "Flash EEPROM array with Negative Gate Voltage Erase Operation."

U.S. Pat. No. 5,029,130 of Yeh for "Single Transistor Non-Volatile Electrically Alterable Semiconductor Memory Device" stating that "local enhancement of the electric field can be due to the unsmoothed grain size of the floating gate 22 or asperity on the floating gate 22 which is typically made of polysilicon . . . " The insulating dielectric beneath the floating gate is formed by thermally growing silicon oxide, silicon nitride, or silicon oxynitride from 50 Å to 200 Å thick. Then a LPCVD layer of amorphous silicon is deposited upon the insulation dielectric. Next a silicon nitride dielectric layer is deposited, followed by treatment in a diffusion furnace, converting the amorphous silicon into single crystalline silicon. A patent related to the Yeh patent is U.S. Pat. No. 5,067,108 of Jenq for "Single Transistor Non-Volatile Electrically Alterable Semiconductor Memory Device with a Re-crystallized Floating Gate."

Because of the tunneling oxide window, the cell size of the conventional EEPROM cell is very large. The programmability of a triple polysilicon cell is not consistent.

A conventional FLOTOX (FLOating Gate Tunnel OXide) cell is large in size but easy to produce. The Flotox device includes a tunneling window opened by lithography to form the floating gate in proper alignment with an N+ ion implanted region in the substrate, which is also formed by use of photolithographic steps. Accordingly, since production of such a Flotox device requires several photolithographic steps, there are alignment problems.

SUMMARY OF THE INVENTION

Because of the tunneling oxide window, the cell size of the conventional EEPROM cell is very large. The programmability of a triple polysilicon cell is not consistent.

A textured polysilicon cell is very difficult to produce because the polysilicon to polysilicon tunneling affects control, but cell size is small.

(Polysilicon to polysilicon tunneling) Program: tunneling from silicon substrate to the first layer of polysilicon erase: electron tunneling from the first polysilicon layer to the second polysilicon layer in the device; but the voltage for tunneling from the first polysilicon layer to the second polysilicon layer is very difficult to control.

This invention provides an EEPROM with a small cell size, which is easy to produce because the tunneling is from a doped region in the silicon substrate to the polysilicon, rather than from polysilicon to polysilicon.

A first advantage of this invention is the small cell size because of the self-aligned tunneling oxide window.

Another advantage of this invention is that the channel length of the EEPROM is not influenced by alignment problems.

In accordance with this invention, a method of forming an EEPROM memory cell on a semiconductor substrate, comprises forming a first dielectric layer on the substrate, forming a gate electrode of a select transistor and a first layer of a floating gate electrode of an EEPROM device on the dielectric layer, forming ion implanted regions in the substrate adjacent to the gate electrode and the first layer of the floating gate electrode, the ion implanted regions comprising source/drain regions formed proximate to at least the periphery of the gate electrode and the first layer of the floating gate electrode, the central region of the ion implanted regions being located between the gate electrode and the first layer of the floating gate electrode, forming a tunneling oxide layer above the central region using the electrodes to form the boundaries of the tunneling oxide layer, forming a second layer of the floating gate electrode in contact with the first layer of the floating gate electrode and in contact with the upper surface of the tunneling oxide layer, forming additional dielectric material over the upper surface of the device, and forming a control gate electrode deposited upon the surface of the additional dielectric material.

Preferably, the tunneling oxide layer is formed by self-aligned lithography; the first dielectric layer is removed from the central region prior to formation of the tunneling oxide; after the floating gate structure is formed spacers are formed adjacent to the first floating gate electrode layer and the gate electrode, followed by forming the tunneling oxide layer above the central region; after the floating gate structure is formed spacers are formed adjacent to the first floating gate layer, followed by forming the tunneling oxide layer above the central region; the floating gate is formed by deposition of a plurality of layers of polysilicon with an intermediate tunneling oxide dip; the floating gate is formed by deposition of a plurality of layers of polysilicon with an intermediate tunneling oxide dip followed by formation of an interpolysilicon layer prior to formation of the control gate electrode; the floating gate is formed by deposition of a plurality of layers of polysilicon and the additional dielectric material comprises an interpolysilicon layer applied prior to formation of the control gate electrode.

In accordance with another aspect of this invention, a method of forming an EEPROM memory cell on a semiconductor substrate, comprises forming a first gate oxide layer on the substrate, forming a first polysilicon layer, forming a silicon nitride layer over the first polysllicon layer, forming a silicon dioxide layer over the silicon nitride layer, patterning the first polysilicon layer, the silicon nitride layer and the silicon dioxide layer into a gate electrode of a select transistor comprising a stack of the first polysilicon layer, the silicon nitride layer and the silicon dioxide layer, patterning the first polysilicon layer, the silicon nitride layer and the silicon dioxide layer into a floating gate electrode of an EEPROM device on the gate oxide layer comprising an EEPROM stack of the first polysilicon layer, and the silicon nitride layer with the silicon dioxide layer removed from the EEPROM stack, forming ion implanted regions in the substrate adjacent to the gate electrode and the first layer of the floating gate electrode, the ion implanted regions comprising source/drain regions formed proximate to at least the periphery of the gate electrode and the first layer of the floating gate electrode, the central region of the ion implanted regions being located between the gate electrode and the first layer of the floating gate electrode, forming spacers adjacent to the first layer of the floating gate electrode and the gate electrode, forming a tunneling oxide layer above the central region using the electrodes to form the boundaries of the tunneling oxide layer, forming a second layer of the floating gate electrode in contact with the first layer of the floating gate electrode and in contact with the upper surface of the tunneling oxide layer, forming additional dielectric material over the upper surface of the device, and forming a control gate electrode deposited upon the surface of the additional dielectric material.

Preferably, the tunneling oxide layer is formed by self-aligned lithography; the first gate oxide layer is removed from above the central region prior to formation of the tunneling oxide; the tunneling oxide layer is formed by self-aligned lithography; the floating gate is formed by deposition of a plurality of layers of polysilicon with an intermediate tunneling oxide dip; the floating gate is formed by deposition of a plurality of layers of polysilicon with an intermediate tunneling oxide dip followed by formation of an interpolysilicon layer prior to formation of the control gate electrode; the floating gate is formed by deposition of a plurality of layers of polysilicon with an intermediate tunneling oxide dip followed by formation of an interpolysilicon ONO layer prior to formation of the control gate electrode on the ONO layer.

In accordance with another aspect of this invention, an EEPROM memory cell formed on a semiconductor substrate, a first dielectric layer on the substrate, a gate electrode of a select transistor formed on the dielectric layer, a first layer of a floating gate electrode of an EEPROM device formed on the dielectric layer, ion implanted regions in the substrate adjacent to the gate electrode and the first layer of the 10floating gate electrode, the ion implanted regions comprising source/drain regions formed proximate to at least the periphery of the gate electrode and the first layer of the floating gate electrode, the central region of the ion implanted regions being located between the gate electrode and the first layer of the floating gate electrode, a tunneling oxide layer above the central region between the electrodes, a second layer of the floating gate electrode in contact with the first layer of the floating gate electrode and in contact with the upper surface of the tunneling oxide layer, additional dielectric material over the upper surface of the device, and a control gate electrode formed upon the surface of the additional dielectric material.

Preferably, spacers are formed adjacent to the first floating gate electrode layer and the gate electrode, with the the tunneling oxide layer above the central region being formed between the spacers; the floating gate comprises a plurality of layers of polysilicon and the additional dielectric material comprises an interpolysilicon layer between the floating gate electrode and the control gate electrode; the floating gate comprises a plurality of layers of polysilicon treated with an intermediate tunneling oxide dip, covered by an interpolysilicon ONO layer upon which is formed the control gate electrode.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
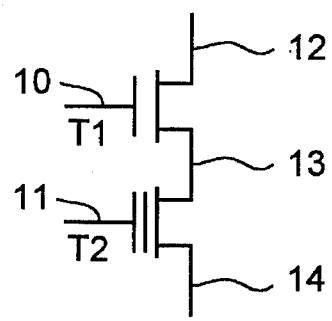
FIG. 1 shows an EEPROM cell in accordance with this invention with a select transistor and an EEPROM transistor connected in series.

FIG. 1 shows an EEPROM cell in accordance with this invention with a select transistor T1 and an EEPROM transistor T2 connected in series.

Figure 2A:
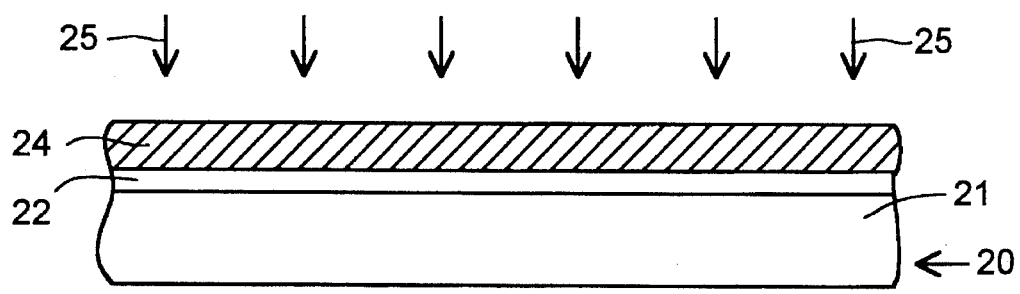
FIGS. 2A and 2B show cross sectional views of a device in accordance with this invention in early stages of manufacture.

Referring to FIGS. 2A a cross sectional view is shown of a device 20 in accordance with this invention formed on a lightly doped P– substrate 21 is shown in early stages of manufacture by a process in accordance with this invention. The steps performed produce the result shown in FIG. 2A, which steps are as follows:

Formation of Gate Oxide Layer

A blanket gate oxide ($SiO_2$) layer 22 is formed on semiconductor P-substrate 21 by the process of thermal growth in a furnace chamber within the temperature range from 700° C. to 1,000° C. and within a pressure range from 1 mTorr to 1,000 Torr.

Deposition of Polysilicon Layer

The next step of the process is the formation over gate oxide layer 22 of a blanket layer of a first polysilicon gate layer 24, followed by conventional doping with dopant 25. The first polysilicon gate layer 24 is deposited by the process of LPCVD (Low Pressure Chemical Vapor Deposition) within a pressure range from 0.1 mTorr to 100 Torr at a temperature from 500° C. to 750° C.

Doping of the first polysilicon gate layer 24 is performed with application of $POCl_3$ or implantation at a doping level from $1 \text{ E } 17 \text{ cm}^{-3}$ to $1 \text{ E } 22 \text{ cm}^{-3}$.

Deposition of Silicon Nitride Layer

Figure 2B:
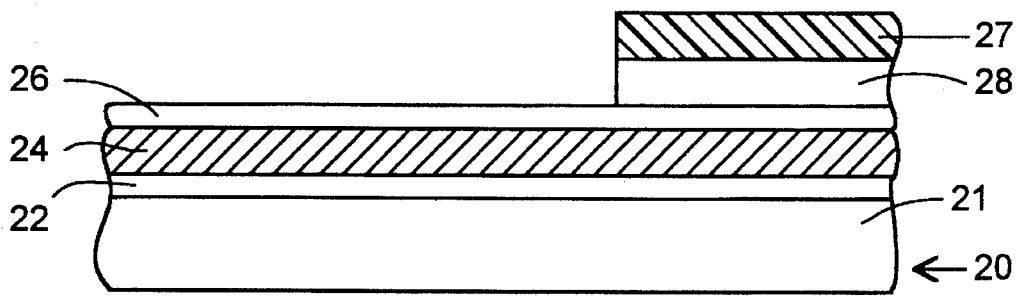

FIG. 2B shows the device 20 of FIG. 2A after a blanket layer 26 of silicon nitride ($Si_3N_4$) is deposited by LPCVD, having a thickness of from 100 Å to 2000 Å.

Formation of silicon Dioxide Layer

A blanket silicon dioxide ($SiO_2$) layer 28 is formed upon silicon nitride ($Si_3N_4$) layer 26 over silicon nitride layer 26 by deposition or by thermal oxidation.

Lithography for Etching of Silicon Dioxide Layer

A mask 27 is formed upon silicon dioxide layer 28 to protect selected portions thereof. The mask is patterned by depositing photoresist which is then exposed to a pattern and developed in order to pattern silicon dioxide layer 28, as shown in FIG. 2B.

Etching of Silicon Dioxide Layer

An etching process is employed to etch portions of silicon dioxide layer 28 exposed through the openings in mask 27 to remove portions thereof not protected by the mask 27, leaving silicon dioxide layer 28 as shown in FIG. 2B. The etching process is a conventional process selected from RIE and plasma etching in a plasma chamber within the RF power range from 100 watts to 1,500 watts and within a pressure range from 1 mTorr to 100 Torr.

Next, the mask 27 is stripped from the device 20.

Figure 3:
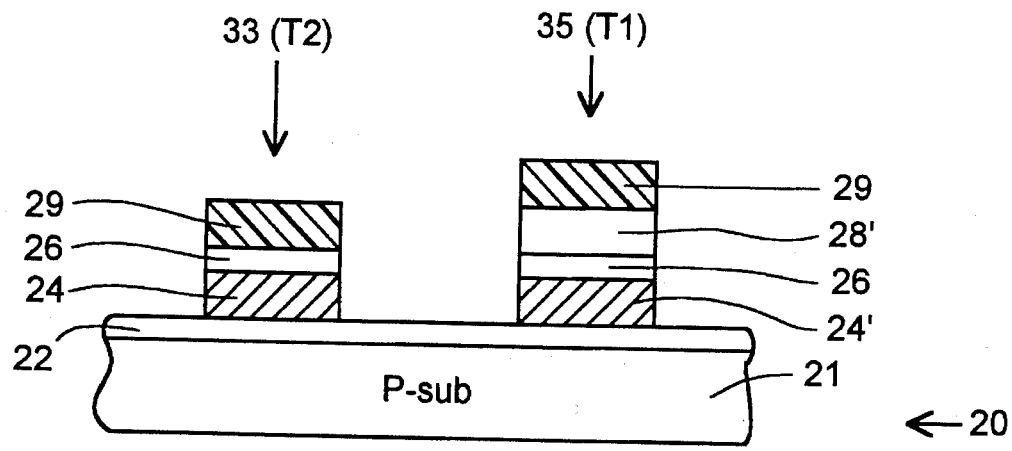
FIG. 3 shows the device of FIG. 2B after steps are performed to produce a select transistor stack of layers useful for forming a select transistor and for forming an EEPROM transistor stack.

Referring to FIG. 3 the device 20 of FIG. 2B is shown after steps are performed to produce a select transistor stack 35 (T1) of layers useful for forming a select transistor 35 (T1 in FIG. 1) and for forming an EEPROM transistor stack 33 (T2 in FIG. 1.)

Lithography for Patterning of Polysilicon Layer

A first polysilicon photoresist mask 29 is formed (by depositing photoresist layer 29 which is then exposed to a pattern and developed into the pattern shown) upon the remaining portions of silicon dioxide layer 28 and on silicon nitride layer 26 for further etching of silicon dioxide layer 28, and initiating etching of silicon nitride layer 26 as well as the first polysilicon floating gate layer 24, as well, in order to pattern first polysilicon floating gate electrode 24 in stack 33 (T2) and gate electrode 24' in stack 35(T1).

Additional Etching of Silicon Dioxide Layer

The silicon dioxide layer 28 is etched down to silicon nitride ($Si_3N_4$) layer 26 by CVD through the openings in the mask 29 formed in the preceding step, leaving as a remainder the silicon dioxide element 28' of select transistor stack 35 (T1). The etching process used is selected from RIE and plasma etching in a plasma chamber within the RF power range from 100 watts to 1,500 watts and within a pressure range from 1 mTorr to 100 Torr. The material from layer 28 remaining comprises silicon dioxide structure 28' forming the top layer of this early phase of forming EEPROM transistor stack 33 (T2).

Etching of Silicon Nitride Layer

The silicon nitride ($Si_3N_4$) layer 26 is then etched through the same openings in the same mask 29. The etching extends down to first polysilicon floating layer 24 by means of plasma etching in a plasma chamber within the RF power range from 50 watts to 1,500 watts and within a pressure range from 1 mTorr to 100 Torr. The material from layer 26 remaining comprises silicon nitride structures 26 forming the top layers of this early phase of forming EEPROM transistor (T2) stack 33 and an intermediate layer of select transistor (T1) stack 35.

Etching of Polysilicon Layer

Next, the first polysilicon layer 24 is etched down to layer 22 through the same openings in the same mask 29 patterning first polysllicon floating gate electrode 24 in stack 33 (T2) and gate electrode 24' in stack 35(T1). This etching step uses plasma etching in a plasma chamber within the RF power range from 50 watts to 1,500 watts and within a pressure range from 1 mTorr to 100 Torr leaving the full stack 35 of select transistor T1, and the early stages of formation of stack 33 of EEPROM transistor T2.

Next, the mask 29 is stripped from the device 20.

The result is an EEPROM transistor stack 33 of layers 24 and 26 (transistor T2) and a select transistor stack 35 of layers 24', 26 and 28' (transistor T1).

Formation of Source/Drain Mask

Figure 4A:
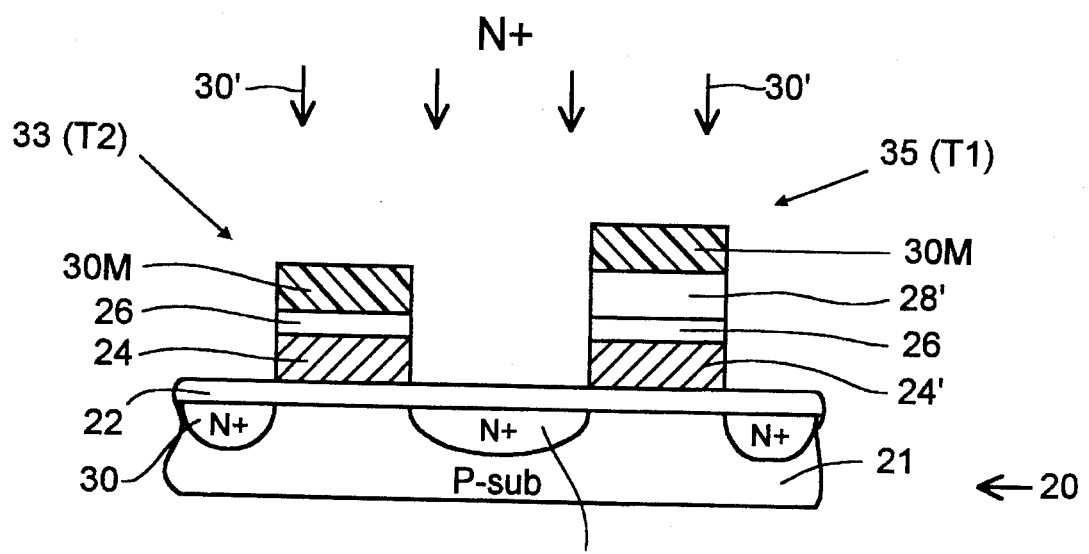
FIGS. 4A–4C show the device of FIG. 3 after steps are performed to form N+ lithography, N+ ion implantation, CVD oxide deposition, and spacer etching of the CVD deposit.

Referring to FIG. 4A, the product of FIG. 3 is shown after formation of source/drain mask 30M. The conventional photolithographic mask 30M, which is formed over device 20 over stacks 33 (T2) and 35 (T1), is adapted for use while performing source/drain ion implantation. The mask 30M is to be used in N+ lithography for ion implantation of source/drain regions 30, 31 and 32 in P-substrate 21 of device 20, as described next.

N+ Source/Drain Ion Implantation

Then N+ ions 30' are implanted through the openings in mask 30M to form N+ doped source/drain regions 30, 31 and 32. An N+ source/drain implant is preferably provided using the ions 30' of arsenic with a dose of between 1 E 13 cm$^{-2}$ and 1 E 16 cm$^{-2}$ with an energy of between 30 keV and 60 keV, with the implanted dopant reaching a depth of between 200 Å and 1000 Å.

Heat is applied to drive the ions 30' into the source drain regions 30, 31 and 32 in device 20. That heat is applied to anneal the device 20 at from 600° C. to 1000° C. for a time range from 10 minutes to 2 hours.

Deposition of CVD Spacer Silicon Dioxide Layer

Figure 4B:
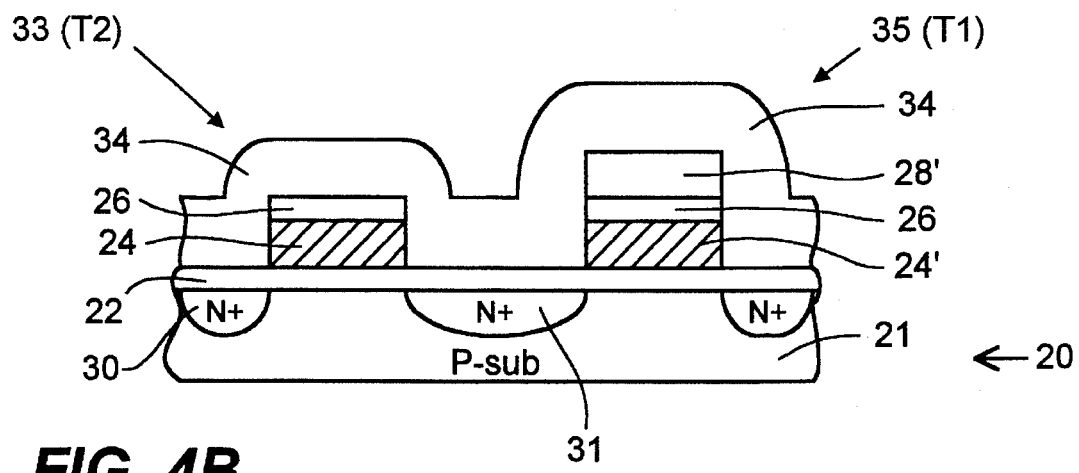

Referring to FIG. 4B, the device 20 of FIG. 4A is shown after formation thereon of a blanket silicon dioxide spacer layer 34. The silicon dioxide spacer layer 34 is deposited by the process of thermal growth in a furnace chamber within a temperature range from 700° C. to 1,000° C. and within a pressure range from 1 mTorr to 1,000 Torr.

Etching of Spacer Layer

Figure 4C:
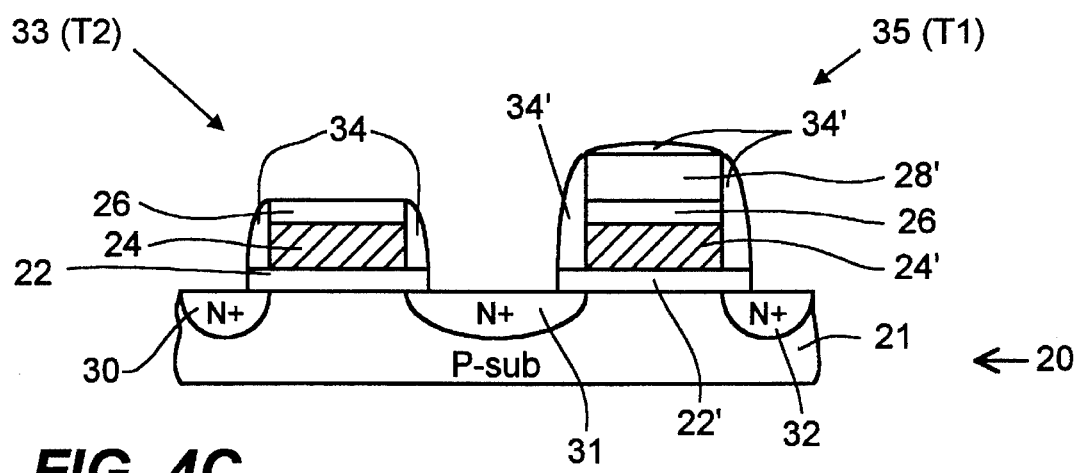

The spacer layer 34 is etched in a "spacer etch" leaving the spacer structures 34 and 34' in stacks 33 (T2) and 35 (T1) respectively as shown in FIGS. 4C. The silicon dioxide spacer layer 34 is etched by using an etching process selected from RIE and plasma etching in a plasma chamber within the RF power range from 100 watts to 1,500 watts and within a pressure range from 1 mTorr to 100 Torr.

Note that gate oxide layer 22 has been removed in areas exposed during the spacer etching step. Portions of gate oxide layer below the remaining spacers 34 and 34' remain, as do those portions beneath the first polysilicon layer 24 of the composite floating gate electrode and select transistor gate 24'.

Reoxidation of Silicon Dioxide Layer

Figure 5A:
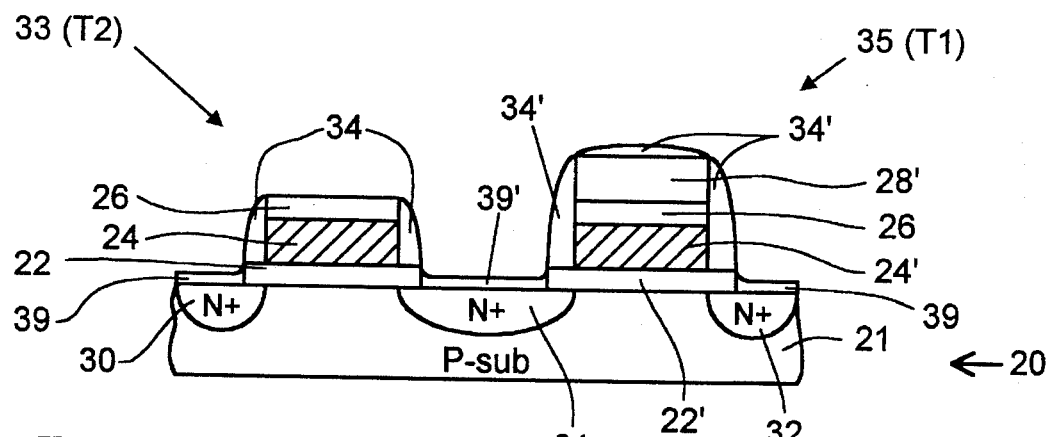
FIGS. 5A–5C show the device of FIG. 4C after steps are performed with a self-aligned, thin tunneling silicon dioxide layer formed over the central N+ region, masking of a portion of the silicon nitride, and etching of the exposed silicon nitride, through the opening in the mask to expose a portion of the upper surface of the lower layer of the floating gate of the EEPROM device.

Referring to FIG. 5A the product of FIG. 4C is shown after a self-aligned, thin tunneling silicon dioxide layer 39' is formed over N+ region 31 to a thickness from 50 Å to 300 Å on semiconductor P-substrate 21 by the process of thermal growth in a furnace chamber within the temperature range from 700° C. to 1,000° C. and within a pressure range from 1 mTorr to 1,000 Torr. In addition, conventional thicker silicon dioxide layers 39 are formed over the exposed surfaces of N+ regions 30 and 32.

Masking of Portion of Silicon Nitride

Figure 5B:
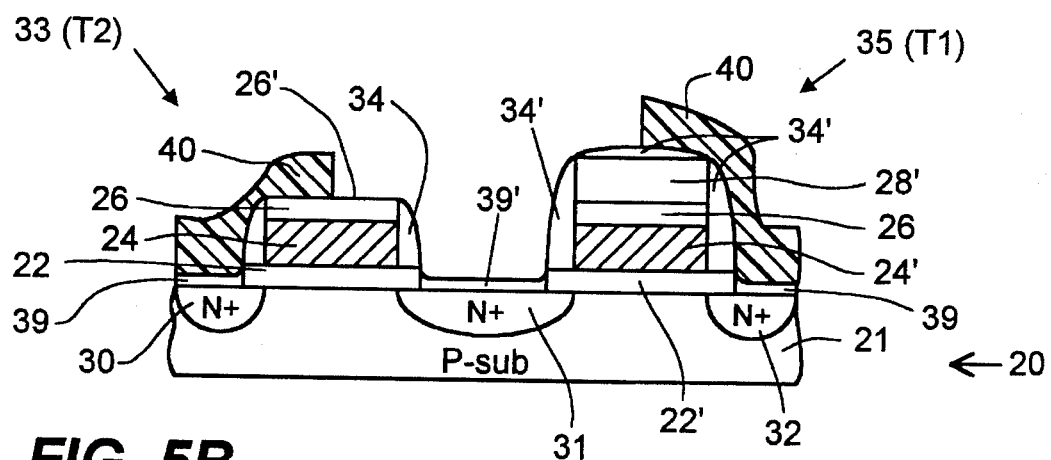

Next as shown in FIG. 5B, the product of FIG. 5A has a mask 40 formed thereon leaving region 26' on the right side of silicon nitride ($Si_3N_4$) layer 26 in the EEPROM transistor stack 33 (T2) exposed. The entire portion of layer 26 included in stack 35 (T1) remains covered by silicon dioxide layer 28.

Etching of Exposed Silicon Nitride

Figure 5C:
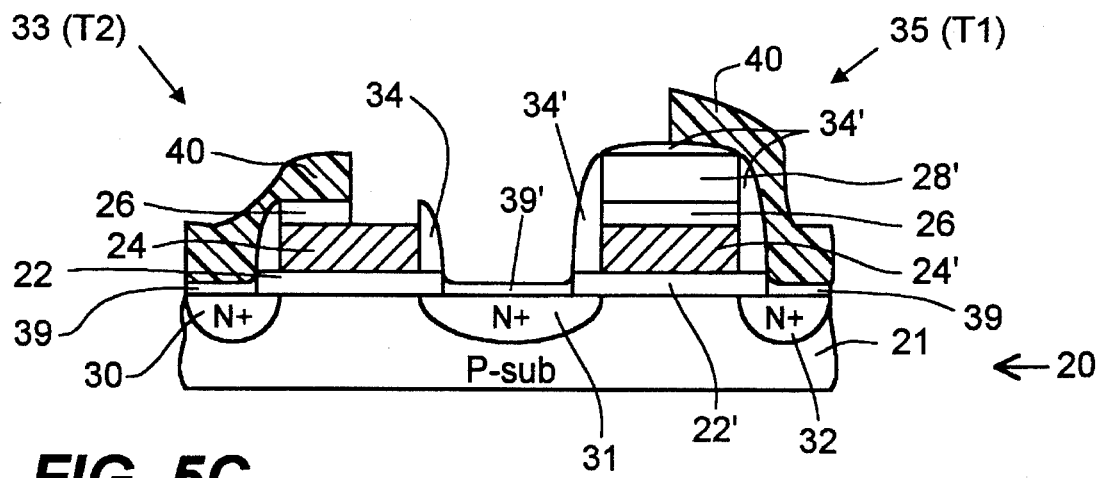

Referring to FIG. 5C, the product of FIG. 5B is shown after region 26' of silicon nitride ($Si_3N_4$) layer 26 has been removed by etching through the opening in mask 40. The etching of silicon nitride layer 26 is performed by means of plasma etching in a plasma chamber within the RF power range from 50 watts to 1,500 watts and within a pressure range from 1 mTorr to 100 Torr.

Next, the mask 40 is stripped from the device 20.

At this point the process can continue along one of two alternative process flow sequences, Alternative A or Alternative B.

ALTERNATIVE A

Considering the first process alternative, alternative A, is described below with reference to FIGS. 6A, 6B, 7A, 7B, 8A, and 8B.

Second Polysilicon Floating Gate

Deposition of Second Polysilicon Floating Gate Layer

Figure 6A:
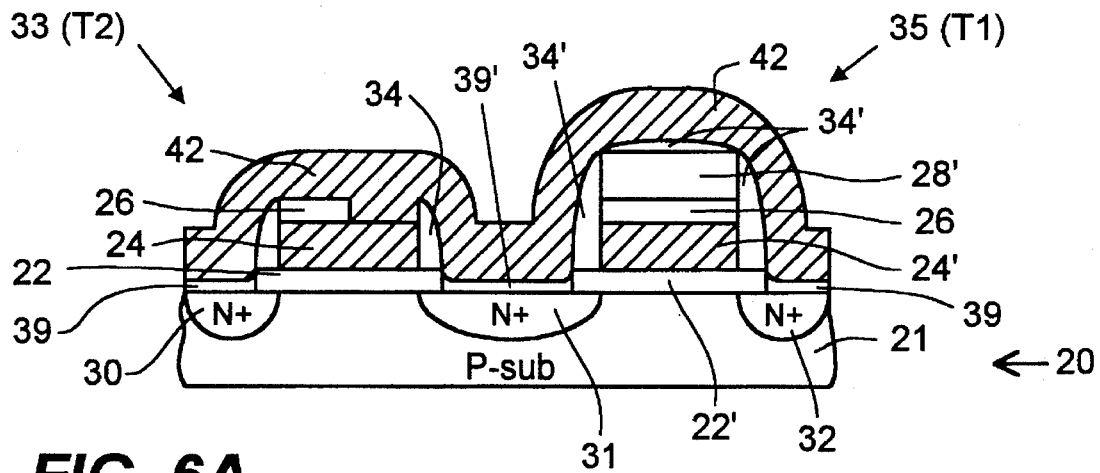
FIGS. 6A–6B show the device of FIG. 5C after steps of alternative A are performed including deposition of the second layer of the floating gate, formation of a mask for that second layer, etching the second layer and a tunneling oxide dip.

Referring to FIG. 6A, the product of FIG. 5C is shown after a blanket (second floating gate) polysilicon layer 42 is deposited upon device 20. The second floating gate polysilicon layer 42 is in direct electrical and mechanical contact with the lower floating gate electrode 24 of the EEPROM transistor 33 (T2) as well as being deposited directly upon thin tunnel oxide layer 39' (which covers N+ region 31). In addition, second floating gate layer 42 is deposited upon gate oxide layer 39, spacer oxide layers 34 and 34' silicon nitride layer 26 and silicon dioxide layer 28', respectively.

The second floating gate polysilicon layer 42 is deposited by the process of LPCVD (Low Pressure Chemical Vapor Deposition) within a pressure range from 0.1 mTorr to 100 Torr at a temperature from 500° C. to 750° C.

Conventional doping of second floating gate polysilicon layer 42 with ions 42' is performed by $POCl_3$ or ion implantation with ions 42' at a doping level within the range from 1 E 17 cm$^{-3}$ to 1 E 22 cm$^{-3}$.

Mask for Second Polysilicon Floating Gate Layer

Figure 6B:
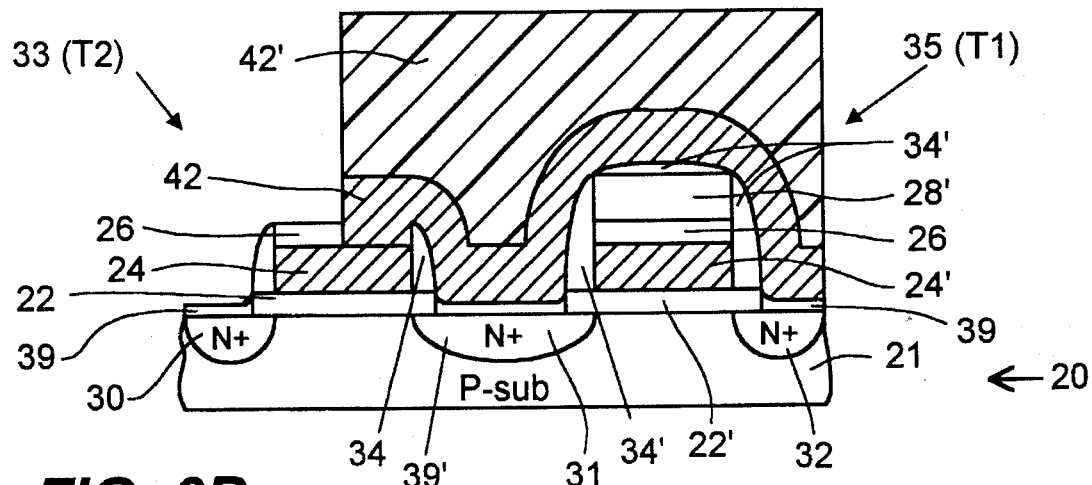

In FIG. 6B, the product of FIG. 6A is shown after a polysilicon photoresist mask 42' is formed by depositing photoresist, patterned by exposure to a pattern in the form of a second floating gate layer. The photoresist 42' is then developed into the pattern shown, whereby the end of layer 42 above the remaining portion of the remaining portion of silicon nitride layer 26 of the select transistor stack 35 (T1) is exposed for removal for removal of unwanted portions of the first polysilicon layer 42 by etching in the next step.

Etching of Second Polysilicon Floating Gate Layer

Referring again to FIG. 6B, the first polysilicon layer 42 is etched through the openings in mask 42' using plasma etching in a plasma chamber within the RF power range from 50 watts to 1,500 watts and within a pressure range from 1 mTorr to 100 Torr. As a result of this etching step as shown by FIG. 6B, the remaining portion of the silicon nitride layer 26 located in the select transistor stack 35 (T1) is exposed.

Tunneling Silicon Dioxide Dip

Next, the device of FIG. 6B is placed in a silicon dioxide wet dip of BOE (Buffered Oxide Etchant) ($NH_4F+HF$ in $H_2O$ (wet solution) or HF solution. The silicon dioxide layer 39 which is exposed comprises a portion of the layer 39 above the N+ region 30 of the EEPROM transistor 33 (T2).

Third Polysilicon Floating Gate

Deposition of Third Polysilicon Floating Gate Layer

Figure 7A:
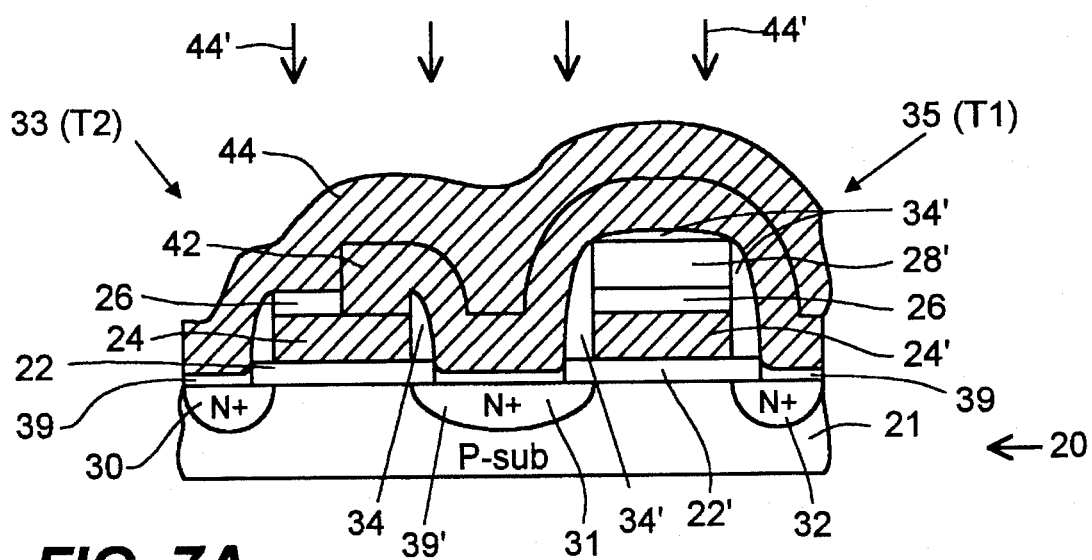
FIGS. 7A–7B show the device of FIG. 6B after steps are taken to deposit a third polysilicon floating gate layer, forming a photolithographic mask, and etching the third floating gate layer.

Referring to FIG. 7A, the device of FIG. 6B is shown after polysilicon layer 44 is deposited upon polysilicon layer 42, spacer oxide structures 34 and 34', silicon nitride layer 26 of EEPROM transistor 33 (T2) etc.

The third floating gate polysilicon layer 44 is deposited by the process of LPCVD (Low Pressure Chemical Vapor Deposition) within a pressure range from 0.1 mTorr to 100 Torr at a temperature from 500° C. to 750° C.

Doping of third floating gate polysilicon layer 44 is performed by $POCl_3$ or ion implantation with ions 44' at a doping level within the range from $1\,E\,17\,cm^{-3}$ to $1\,E\,22\,cm^{-3}$.

Mask for Third Polysilicon Floating Gate Layer

Figure 7B:
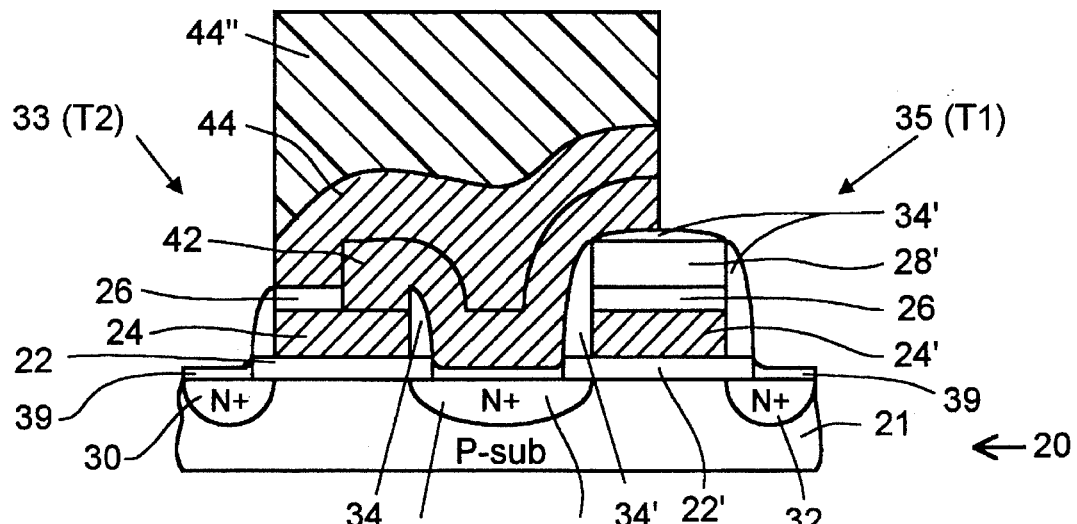

Referring to FIG. 7B, the device of FIG. 7A is shown after formation of photoresist mask 44" by depositing photoresist in blanket form initially. The mask layer 44" is then exposed to a pattern and developed into the form of the desired pattern of the upper level 44 of the floating gate of EEPROM device 35 (T1).

Etching of Third Polysilicon Floating Gate Layer

The third floating gate polysilicon layer 44 is etched through the mask 44" by using plasma etching in a plasma chamber within the RF power range from 50 watts to 1,500 watts and within a pressure range from 1 mTorr to 100 Torr.

Referring to FIG. 8 the steps performed to produce the result shown there are as follows:

ONO (Oxide-Nitride-Oxide) formation

Bottom Silicon Dioxide

Figure 8A:
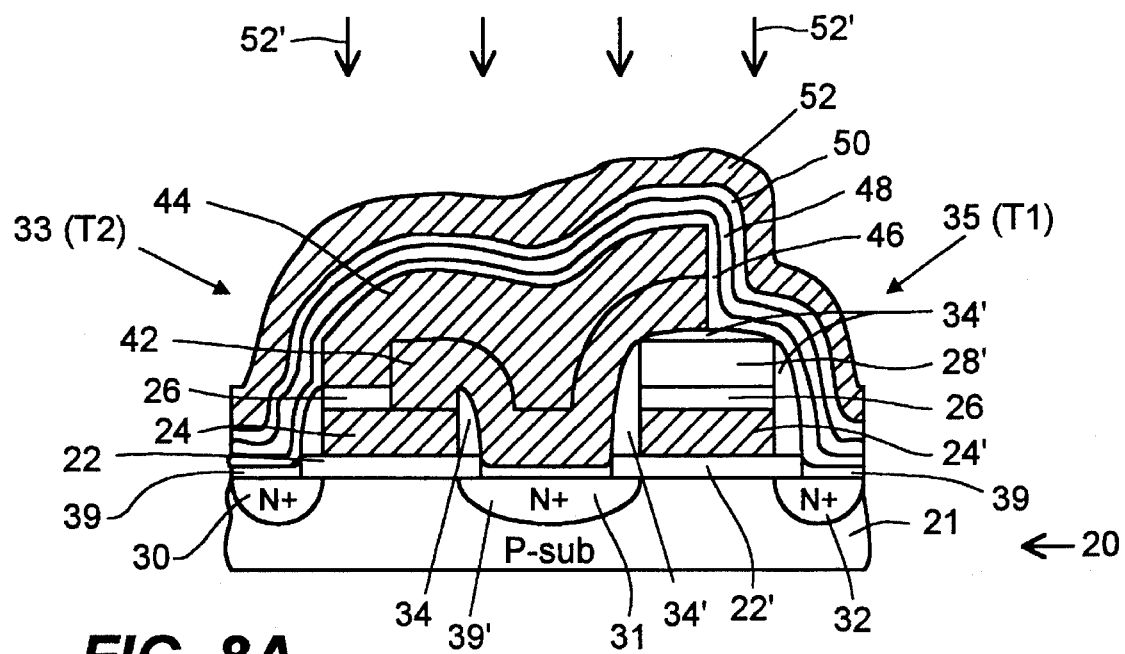
FIGS. 8A–8B show the device of FIG. 7B after steps are taken to form an ONO blanket layer, and deposition, doping and patterning of the polysilicon control gate layer.
Figure 8B:
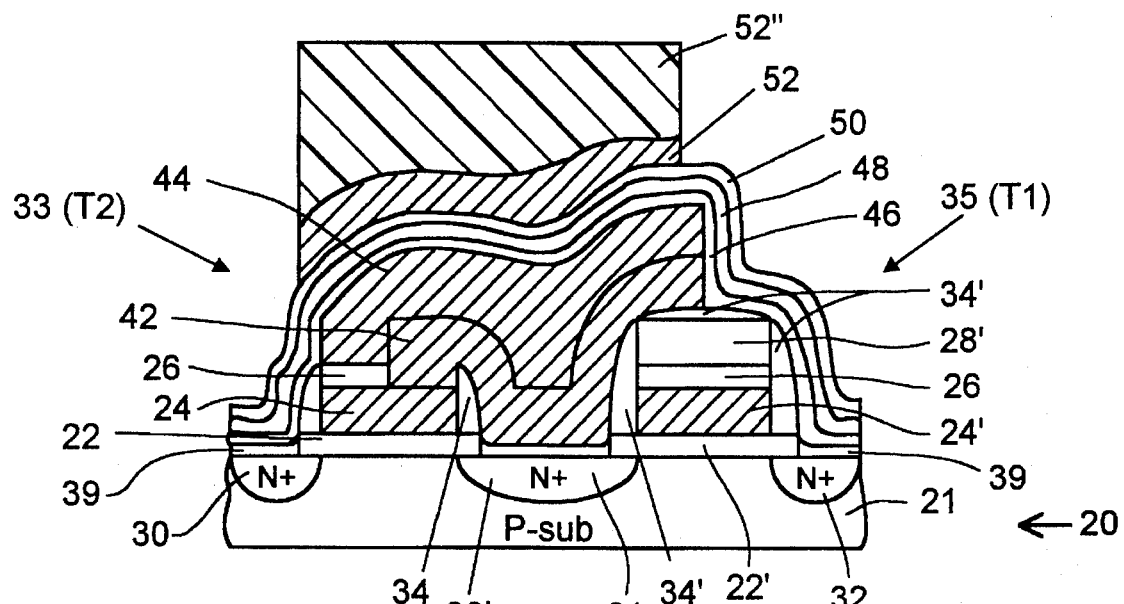

Referring to FIG. 8A, the device of FIG. 7B after a number of steps have been performed starting with deposition of a thin silicon dioxide (Oxide) layer 46. The silicon dioxide layer 46 is deposited by the process of thermal growth in a furnace chamber within the temperature range from 700° C. to 1,000° C. and within a pressure range from 1 mTorr to 1,000 Torr.

Deposition of Intermediate Silicon Nitride Layer

Referring again to FIG. 8A, deposition of silicon nitride ($Si_3N_4$) layer 48 follows. Layer 48, frequently referred to in the art as (nitride), is deposited by LPCVD with a conventional thickness to a thickness of from 50 Å to 200 Å.

Silicon Nitride Oxidation

Finally the silicon nitride ($Si_3N_4$) layer 48 is oxidized to form (Oxide) a silicon dioxide layer 50 by heating layer 48 in a furnace with gases comprising $O_2$ or $O_2/H_2$ at a temperature within the range from 800° C. to 1000° C. for a duration within the range from 10 minutes to two hours.

Deposition of Polysilicon Control Gate Layer

Next, a control gate polysilicon layer 52 is deposited upon ONO layers 64, 66 and 68, followed by conventional doping.

The polysilicon layer 52 is deposited by the process of LPCVD (Low Pressure Chemical Vapor Deposition) within a pressure range from 0.1 mTorr to 100 Torr at a temperature from 500° C. to 750° C.

Doping of polysilicon layer 52 is performed by $POCl_3$ or ion implantation with ions 52' at a doping level within the range from $1\,E\,17\,cm^{-3}$ to $1\,E\,22\,cm^{-3}$.

Mask for Control Gate Layer

A polysilicon photoresist mask 52" (control gate) is formed by depositing photoresist layer 52 as a blanket of photoresist which is then exposed to a pattern and developed into the form the control gate of EEPROM device 33 (T2), which is to be patterned in the next step.

Etching of Control Gate Layer

The polysilicon layer 52 is etched through the mask 55" using plasma etching in a plasma chamber within the RF power range from 50 watts to 1,500 watts and within a pressure range from 1 mTorr to 100 Torr yielding the completed device, prior to conventional steps required to make a commercial device as is well understood by those skilled in the art.

ALTERNATIVE B

The first process alternative, referred to as Alternative B, is described below with reference to FIGS. 9, 10, and 11.

Mask Protecting Self-Aligned Tunneling Silicon Dioxide

Figure 9:
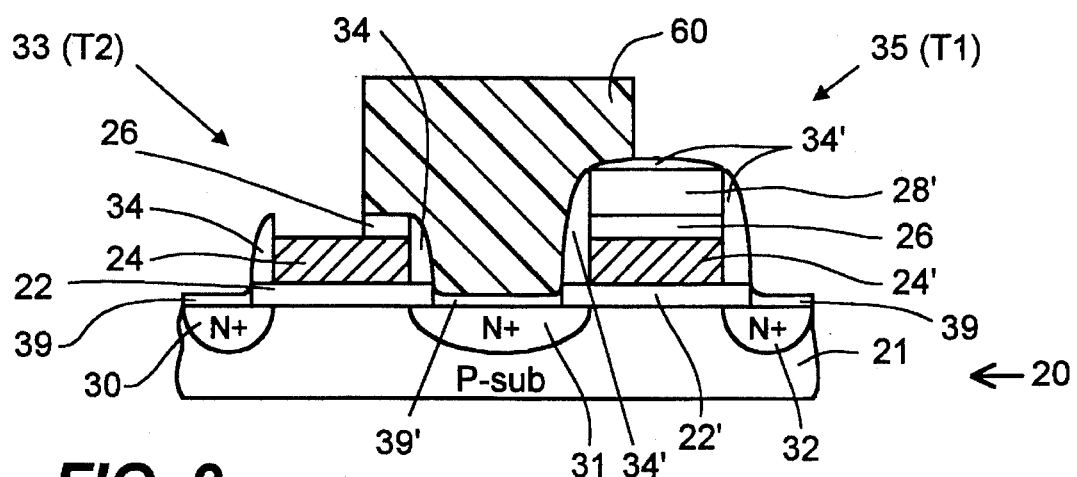
FIGS. 9 shows the device of FIG. 5A after steps of alternative B are performed including formation of a mask for protecting the tunnel oxide layer followed by etching of exposed silicon dioxide.

Referring to FIG. 9 the device of FIG. 5A is shown after the formation of a mask 60 for protection of the self-aligned tunneling silicon dioxide layer 39' formed as shown in FIG. 5A.

The lithographic mask 60 is formed by means of conventional lithography.

Etching of Silicon Nitride and Silicon Dioxide

The exposed surfaces of silicon nitride layer 26 in select gate stack 35 (T1) is 39 are etched by CVD through the openings in mask 60. The etching of silicon nitride is performed by means of plasma etching in a plasma chamber within the RF power range from 50 watts to 1,500 watts and within a pressure range from 1 mTorr to 100 Torr.

Etching of Silicon Dioxide

The exposed surfaces of silicon dioxide layers 39 are also etched by CVD through the openings in mask 60. The etching process uses an etching process selected from RIE and plasma etching in a plasma chamber within the RF power range from 100 watts to 1,500 watts and within a pressure range from 1 mTorr to 100 Torr.

Figure 10:
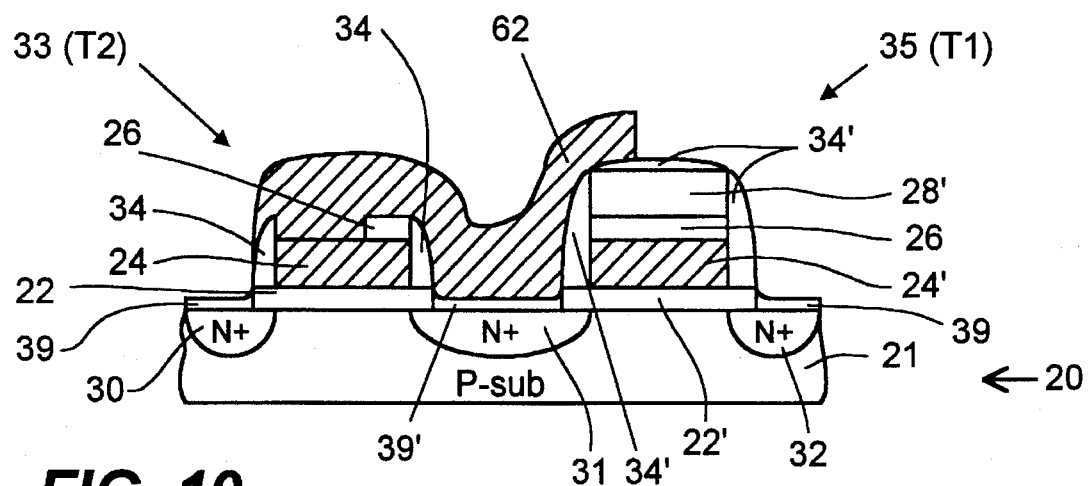
FIG. 10 shows the device of FIG. 9 after deposition of deposition of the second and final layer of the floating gate, formation of a mask for that second layer, and etching that second layer with the pattern of the mask.

Referring to FIG. 10 the steps performed to produce the result shown there are as follows:

Second Polysilicon Floating Gate

Deposition of Second Polysilicon Floating Gate Layer

A second floating gate polysllicon layer 62 is deposited upon polysllicon floating gate electrode 24 in direct electrical and mechanical contact with the exposed portion of polysilicon floating gate electrode 24 and in direct contact with tunnel oxide layer 39'. Layer 62 also extends over the remainder of silicon nitride layer 26 and over spacer layers 34 and 36, etc. After deposition, layer 62 is doped by a conventional doping process, as shown in FIG. 6A.

The polysilicon layer 62 is deposited by the process of LPCVD (Low Pressure Chemical Vapor Deposition) within a pressure range from 0.1 mTorr to 100 Torr at a temperature from 500° C. to 750° C.

Mask for Second Polysilicon Floating Gate Layer

A polysilicon photoresist mask (not shown since it is of the kind provided in FIG. 6B) is formed by depositing photoresist, patterned by exposure to a pattern in the form of a second floating gate layer 62 shown in FIG. 10. That photoresist is then developed into the pattern shown, whereby the end of layer 62 above the remaining portion of the remaining portion of silicon nitride layer 26 of the select transistor stack 35 (T1) is exposed for removal of unwanted portions of the first polysilicon layer 62 by etching in the a subsequent step.

Masking of Second Polysilicon Floating Gate Layer

Referring to FIG. 10, a polysilicon photoresist mask (not shown) for floating gate layer 62 is formed by depositing photoresist which is exposed to a pattern and developed patterned into the form of floating gate 62.

Etching of Second Polysilicon Floating Gate Layer

The polysilicon layer 62 is etched through the openings in mask 60 using plasma etching in a plasma chamber within the RF power range from 50 watts to 1,500 watts and within a pressure range from 1 mTorr to 100 Torr. As a result of this etching step (analogous to what is shown by FIG. 6B) the surface of remaining portion of the silicon nitride layer 26 located in the select transistor stack 35 (T1) and the remainder of select transistor gate 24 are covered with polysilicon floating gate layer 62.

Figure 11:
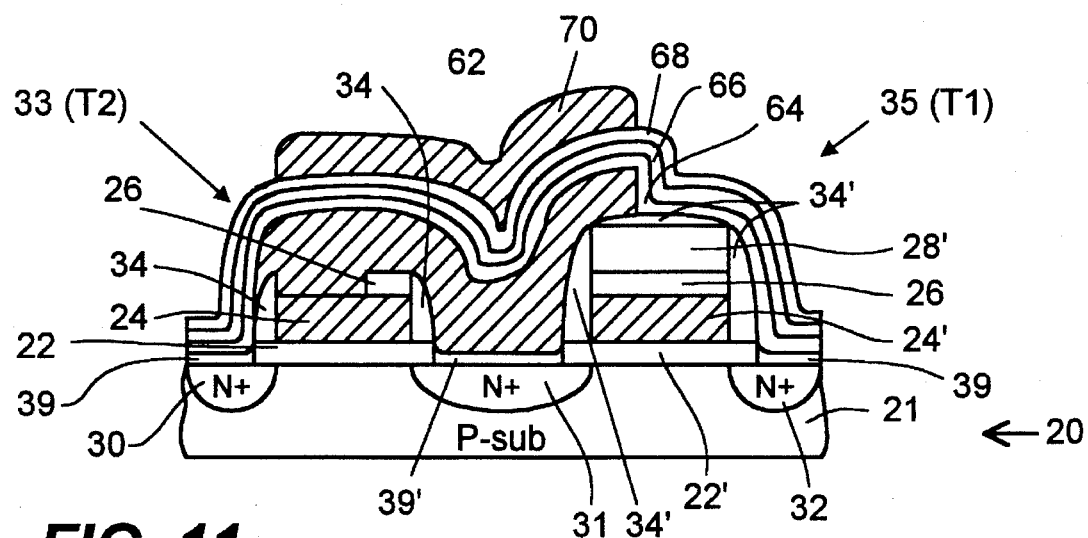
FIG. 11 shows the device of FIG. 10 after steps are taken to form an ONO blanket layer, and deposition, doping and patterning of the polysilicon control gate layer.

Referring to FIG. 11 the steps performed to produce the result shown there are as follows:

ONO (Oxide-Nitride-Oxide) formation

Bottom Silicon Dioxide

Silicon dioxide is deposited to form a layer of silicon dioxide layer 64. The silicon dioxide layer 64 is deposited by the process of thermal growth in a furnace chamber within the temperature range from 700° C. to 1,000° C. and within a pressure range from 1 mTorr to 1,000 Torr.

Deposition of Intermediate Silicon Nitride Layer

Referring again to FIG. 11, deposition of silicon nitride ($Si_3N_4$) layer 66 follows. Layer 66, frequently referred to in the art as (nitride), is deposited by LPCVD with a conventional thickness to a thickness of from 50 Å to 200 Å.

Silicon Nitride Oxidation

Finally the silicon nitride ($Si_3N_4$) layer 66 is oxidized to form (Oxide) a silicon dioxide layer 68 by heating layer 66 in a furnace with gases comprising $O_2$ or $O_2/H_2$ at a temperature within the range from 800° C. to 1000° C. for a duration within the range from 5 minutes to three hours.

Deposition of Polysilicon Control Gate Layer

A control gate polysilicon layer 70 is deposited upon ONO layers 64, 66 and 68, followed by conventional doping. The polysilicon layer 70 is deposited by the process of LPCVD (Low Pressure Chemical Vapor Deposition) within a pressure range from 0.1 mTorr to 100 Torr at a temperature from 500° C. to 750° C. The polysilicon layer 70 is deposited by the process of LPCVD (Low Pressure Chemical Vapor Deposition) within a pressure range from 0.1 mTorr to 100 Torr at a temperature from 500° C. to 750° C.

Doping of polysilicon layer 70 is performed by $POCl_3$ or ion implantation with ions 70' at a doping level within the range from 1 E 17 $cm^{-3}$ to 1 E 22 $cm^{-3}$.

Mask for Control Gate Layer

A polysilicon photoresist mask for control gate layer 70 is then formed by depositing photoresist layer 70 as a blanket of photoresist. The photoresist mask (not shown since it is analogous to the mask 52" in FIG. 8B) is formed by depositing photoresist which is then exposed to a pattern and developed in the form of control gate layer 70 in the form the control gate of EEPROM device 33 (T2), which is to be patterned in the next step.

Etching of Control Gate Layer

The polysilicon control gate layer 70 is etched through that mask using plasma etching in a plasma chamber within the RF power range from 50 watts to 1,500 watts and within a pressure range from 1 mTorr to 100 Torr yielding the completed device 20, prior to conventional steps required to make a commercial device as is well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An EEPROM memory formed on a semiconductor substrate, comprising:

first dielectric layer on said semiconductor substrate;

a select transistor having a select transistor gate electrode formed on said dielectric layer;

a first layer of a floating gate electrode formed on said dielectric layer;

doped source/drain regions in said substrate adjacent to said select transistor gate electrode and said first layer of said floating gate electrode, a central doped source/drain region being located between said select transistor gate electrode and said first layer of said floating gate electrode, said first dielectric layer having a tunneling oxide region above at least a portion of said central doped source/drain region;

a second layer of said floating gate electrode in contact with said first layer of said floating gate electrode and in contact with an upper surface of said tunneling oxide region, wherein said first layer and said second layer of said floating gate electrode are conductive and wherein said first layer of said floating gate electrode is in direct electrical contact with said second layer of said floating gate electrode;

a third layer of said floating gate electrode disposed at least partially above said second layer of said floating gate electrode with said third layer of said floating gate electrode in contact with said second layer of said floating gate electrode;

a second layer of dielectric material disposed at least partially between said third layer of said floating gate electrode and said first layer of said floating gate electrode;

a third layer of dielectric material over at least a portion of an upper surface of said floating gate electrode; and a control gate electrode formed on a surface of said third layer of dielectric material.

2. The EEPROM memory of claim 1, wherein said first layer and said second layer of said floating gate electrode comprise polysilicon doped to a first conductivity type.

3. The EEPROM memory of claim 1, wherein said third layer of said floating gate electrode is separated from said control gate electrode by said second layer of dielectric material.

4. The EEPROM memory of claim 3, wherein said second layer of dielectric material comprises layers of silicon oxide and silicon nitride.

5. The EEPROM memory of claim 1, wherein said first layer, said second layer and said third layer of said floating gate electrode comprise polysilicon doped to a first conductivity type.

6. An EEPROM memory formed on a semiconductor substrate, comprising:

a first dielectric layer on said semiconductor substrate;

a select transistor having a select transistor gate electrode formed on said dielectric layer;

a first layer of a floating gate electrode formed on said dielectric layer, said first layer of said floating gate electrode having a rectangular cross section;

doped source/drain regions in said substrate adjacent to said select transistor gate electrode and said first layer of said floating gate electrode, a central doped source/drain region being located between said select transistor gate electrode and said first layer of said floating gate electrode, said first dielectric layer having a tunneling oxide region above at least a portion of said central doped source/drain region;

a second layer of said floating gate electrode in contact with said first layer of said floating gate electrode and in contact with an upper surface of said tunneling oxide region, wherein said first layer and said second layer of said floating gate electrode are conductive and wherein said first layer of said floating gate electrode is in direct electrical contact with said second layer of said floating gate electrode;

a dielectric spacer structure in contact with said first dielectric layer, said first layer of said floating gate electrode and said second layer of said floating gate electrode;

a second layer of dielectric material over at least a portion of an upper surface of said floating gate electrode; and a control gate electrode formed on a surface of said second layer of dielectric material.

7. An EEPROM memory formed on a semiconductor substrate, comprising;

a first dielectric layer on said semiconductor substrate;

a select transistor having a select transistor gate electrode formed on said dielectric layer;

a first layer of a floating gate electrode formed on said dielectric layer;

doped source/drain regions in said substrate adjacent to said select transistor gate electrode and said first layer of said floating gate electrode, a central doped source/drain region being located between said select transistor gate electrode and said first layer of said floating gate electrode, said first dielectric layer having a tunneling oxide region above at least a portion of said central doped source/drain region;

a second layer of said floating gate electrode in contact with said first layer of said floating gate electrode and in contact with an upper surface of saint tunneling oxide region, wherein said first layer and said second layer of said floating gate electrode are conductive and wherein said first layer of said floating gate electrode is in direct electrical contact with said second layer of said floating gate electrode, wherein said second layer of said floating gate electrode extends above said select transistor gate electrode;

a second layer of dielectric material over at least a portion of an upper surface of said floating gate electrode; and a control gate electrode formed on a surface of said second layer of dielectric material.

8. The EEPROM memory of claim 7, further comprising:

a first dielectric spacer structure in contact with said first dielectric layer, said first layer of said floating gate electrode and said second layer of said floating gate electrode; and a second dielectric spacer structure in contact with said second layer of said floating gate electrode and said select transistor gate electrode.

* * * * *